United States Patent
Kiyoi

(10) Patent No.: US 11,676,996 B2
(45) Date of Patent: Jun. 13, 2023

(54) METHOD OF MANUFACTURING SEMICONDUCTOR DEVICE, AND SEMICONDUCTOR DEVICE

(71) Applicant: Mitsubishi Electric Corporation, Chiyoda-ku (JP)

(72) Inventor: Akira Kiyoi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 82 days.

(21) Appl. No.: 16/607,421

(22) PCT Filed: Apr. 24, 2018

(86) PCT No.: PCT/JP2018/016590
§ 371 (c)(1),
(2) Date: Oct. 23, 2019

(87) PCT Pub. No.: WO2019/017034
PCT Pub. Date: Jan. 24, 2019

(65) Prior Publication Data
US 2020/0135847 A1 Apr. 30, 2020

(30) Foreign Application Priority Data
Jul. 19, 2017 (JP) .............................. JP2017-140098

(51) Int. Cl.
*H01L 29/38* (2006.01)
*H01L 29/06* (2006.01)
(Continued)

(52) U.S. Cl.
CPC ........ *H01L 29/0638* (2013.01); *H01L 21/228* (2013.01); *H01L 21/2253* (2013.01);
(Continued)

(58) Field of Classification Search
CPC .......... H01L 29/0615; H01L 29/66348; H01L 29/7397
See application file for complete search history.

(56) References Cited

U.S. PATENT DOCUMENTS

| 6,610,572 B1 | 8/2003 | Takei et al. |
| 2014/0175620 A1 | 6/2014 | Yoshinari |

(Continued)

FOREIGN PATENT DOCUMENTS

| CN | 103890920 A | 6/2014 |
| JP | 2001-160559 A | 6/2001 |

(Continued)

OTHER PUBLICATIONS

International Search Report dated Jun. 19, 2018 in PCT/JP2018/016590 filed Apr. 24, 2018.
(Continued)

*Primary Examiner* — Trang Q Tran
(74) *Attorney, Agent, or Firm* — Xsensus LLP

(57) ABSTRACT

In a step, acceptor ions are implanted from a back surface of a semiconductor substrate. In a step, a wet process of immersing the semiconductor substrate in a chemical solution including hydrofluoric acid is performed, to introduce hydrogen atoms into the semiconductor substrate. In a step, proton radiation is provided to the back surface of the semiconductor substrate, to introduce hydrogen atoms into the semiconductor substrate and form radiation-induced defects. In a step, an annealing process is performed on the semiconductor substrate, to form hydrogen-related donors by reaction of the hydrogen atoms and the radiation-induced defects and reduce the radiation-induced defects.

6 Claims, 11 Drawing Sheets

(51) Int. Cl.
*H01L 21/225* (2006.01)
*H01L 21/228* (2006.01)
*H01L 21/265* (2006.01)
*H01L 21/322* (2006.01)
*H01L 29/66* (2006.01)
*H01L 29/739* (2006.01)
*H01L 29/861* (2006.01)

(52) U.S. Cl.
CPC .... *H01L 21/26513* (2013.01); *H01L 21/3221* (2013.01); *H01L 29/0615* (2013.01); *H01L 29/66136* (2013.01); *H01L 29/66348* (2013.01); *H01L 29/7397* (2013.01); *H01L 29/861* (2013.01)

(56) References Cited

U.S. PATENT DOCUMENTS

| | | | |
|---|---|---|---|
| 2014/0217407 A1* | 8/2014 | Mizushima | H01L 22/12 257/48 |
| 2014/0246750 A1 | 9/2014 | Takishita et al. | |
| 2014/0299915 A1 | 10/2014 | Kouno et al. | |
| 2015/0050798 A1 | 2/2015 | Kobayashi et al. | |
| 2017/0077218 A1* | 3/2017 | Nishikawa | H01L 29/8611 |
| 2017/0271447 A1 | 9/2017 | Tamura et al. | |

FOREIGN PATENT DOCUMENTS

| | | |
|---|---|---|
| JP | 2013-138172 A | 7/2013 |
| JP | 2015-130523 A | 7/2015 |
| WO | WO 2013/141141 A1 | 9/2013 |

OTHER PUBLICATIONS

German Office Action dated Sep. 9, 2022, in corresponding German Patent Application 112018003666.9, 16pp.

Chinese Office Action dated Feb. 22, 2023 in corresponding Chinese Patent Application No. 201880037604.X (with machine-generated English translation), 14 pages.

* cited by examiner

METHOD OF MANUFACTURING SEMICONDUCTOR DEVICE, AND SEMICONDUCTOR DEVICE

TECHNICAL FIELD

The present invention relates to a method of manufacturing a semiconductor device, and a semiconductor device, and more particularly to a method of manufacturing a semiconductor device including a field stop layer, and a semiconductor device.

BACKGROUND ART

Some semiconductor devices including an insulated gate bipolar transistor (IGBT) or a diode, for example, as a power semiconductor element, have a structure including a field stop layer as an improved measure for meeting the need for lower loss.

A field stop layer is provided, within a drift layer at a position further from a breakdown voltage main junction of the drift layer, as a layer having lower resistance than and the same conductivity type (normally n type) as the drift layer. The field stop layer is formed after a semiconductor functional layer such as a semiconductor element is manufactured on a front surface side of a silicon wafer. Thus, as constraints when forming the field stop layer, the field stop layer needs to be formed under conditions that do not adversely affect the semiconductor functional layer formed on the front surface side of the silicon wafer.

When forming a field stop layer, heat treatment is performed after an impurity is introduced. In recent years, a silicon wafer (semiconductor substrate) is reduced in thickness in order to save energy consumption of a power device. The reduced thickness of the silicon wafer may cause cracking of the silicon wafer due to the heat treatment. Thus, there have been proposed methods in which heat treatment is performed at lower temperature in order to suppress the cracking of a silicon wafer due to the heat treatment during the formation of a field stop layer. That is, there has been proposed a method of forming a field stop layer through conversion into donors by proton radiation (PTL 1 and PTL 2).

PTL 1 proposes a method of recovering, by heat treatment, radiation-induced defects generated by radiation of protons (hydrogen atoms) to a single-crystal silicon wafer, and forming composite defects (hydrogen-related donors) by reaction of the radiation-induced defects and the hydrogen atoms near the location of an average range of the protons, to thereby form a high-concentration field stop layer.

PTL 2 proposes a method of repeating proton radiation multiple times from a back surface of an n type semiconductor substrate, to thereby form an n type field stop layer. During the multiple proton radiations, the locations of radiation-induced defects left by a previous proton radiation are used as targets for the next proton radiation. Hydrogen atoms are thereby supplied to a region having many radiation-induced defects formed by the previous proton radiation, to terminate dangling bonds, leading to conversion of the radiation-induced defects into donors. As a result, according to PTL 2, an n type field stop layer having a high-concentration hydrogen-related donor layer can be formed while increase in leakage current caused by remaining radiation-induced defects is suppressed.

CITATION LIST

Patent Literature

PTL 1: Japanese Patent Laying-Open No. 2001-160559
PTL 2: Japanese Patent Laying-Open No. 2015-130523

SUMMARY OF INVENTION

Technical Problem

One problem with a method of forming a field stop layer by proton radiation is that radiation-induced defects generated in a silicon wafer due to proton radiation to the silicon wafer remain after an annealing process is performed.

The present invention was made to solve such a problem, and has one object to provide a method of manufacturing a semiconductor device in which remaining radiation-induced defects are reduced, and has another object to provide a semiconductor device having reduced remaining radiation-induced defects.

Solution to Problem

A method of manufacturing a semiconductor device according to the present invention includes the following steps. A semiconductor element is formed in a semiconductor substrate having a first main surface and a second main surface and being of a first conductivity type having a first carrier concentration, the semiconductor element being for conducting a current between the first main surface and the second main surface. The forming of the semiconductor element includes the following steps. Acceptor ions are implanted from the second main surface of the semiconductor substrate. From the second main surface of the semiconductor substrate, a wet process of accumulating hydrogen atoms in a region of the semiconductor substrate where the acceptor ions are implanted is performed. Radiation of protons is provided from the second main surface of the semiconductor substrate. After the wet process is performed and the radiation of protons is provided, an annealing process is performed on the semiconductor substrate, to form a field stop layer of the first conductivity type having a second carrier concentration higher than the first carrier concentration in the semiconductor substrate.

A semiconductor device according to the present invention is a semiconductor device including a semiconductor element that conducts a current between a first main surface and a second main surface of a semiconductor substrate of a first conductivity type, and includes an impurity region and a field stop layer of the first conductivity type. The impurity region is formed to a first depth from the second main surface of the semiconductor substrate having a first carrier concentration. The field stop layer is formed from a position of the first depth to a second depth deeper than the first depth in the semiconductor substrate, and has a second carrier concentration higher than the first carrier concentration in the semiconductor substrate. In the field stop layer, a maximum value of the second carrier concentration is located between the first depth and the second depth. The second carrier concentration exhibits a distribution in which the second carrier concentration decreases toward the second main surface from a portion where the maximum value of the second carrier concentration is located. Concentration of radiation-induced defects remaining in the field stop layer is lower than the first carrier concentration in the semiconductor substrate. Hydrogen atoms are accumulated in the impurity region.

Advantageous Effects of Invention

According to the method of manufacturing a semiconductor device in the present invention, a semiconductor device having reduced radiation-induced defects remaining in the field stop layer can be manufactured by performing the wet process and the proton radiation.

According to the semiconductor device in the present invention, the radiation-induced defects remaining in the field stop layer can be reduced.

DESCRIPTION OF EMBODIMENTS

First Embodiment

A semiconductor device including an IGBT is described here as an example of a semiconductor device. First, in the present specification and drawings, a region indicated by "n" means that electrons are the majority carrier. A region indicated by "p" means that holes are the majority carrier. In addition, "+" or "−" is attached to "n" or "p". The "+" indicates that carrier concentration is relatively high. The "−" indicates that carrier concentration is relatively low.

Figure 1:
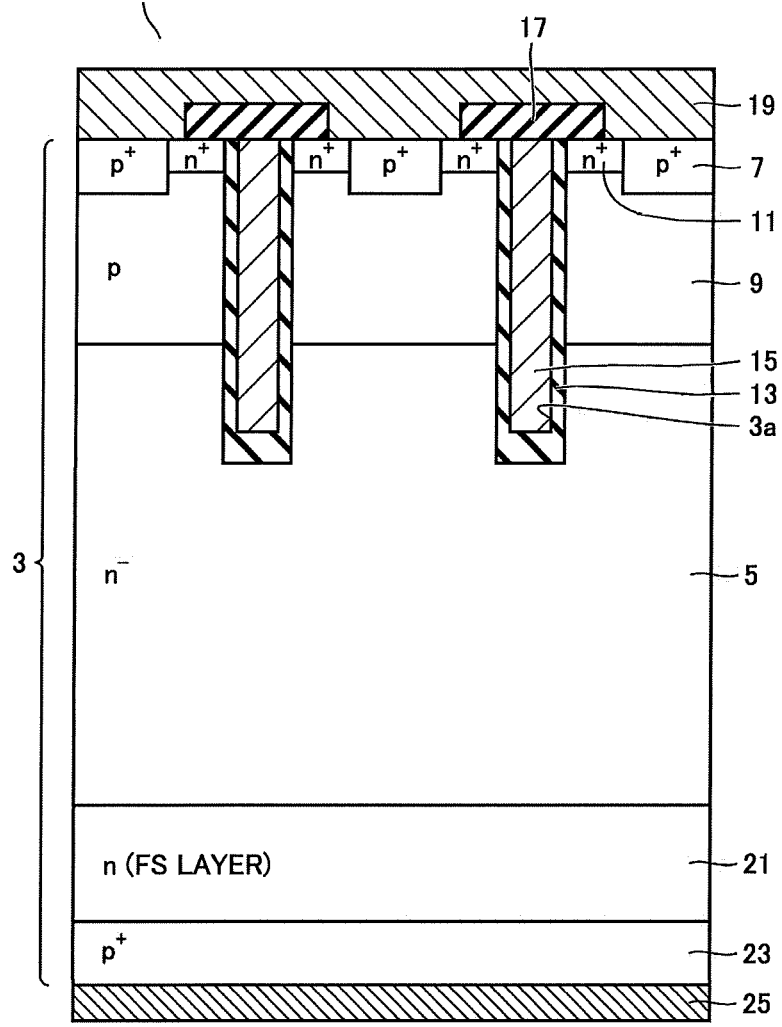
FIG. 1 is a cross-sectional view of a semiconductor device including an IGBT according to a first embodiment.

As shown in FIG. 1, in a semiconductor device 1 including an IGBT 2a, a p type base layer 9 is formed to a certain depth (depth A) from a first main surface of a semiconductor substrate 3. An $n^+$ type emitter layer 11 and a $p^+$ type contact layer 7 are formed in p type base layer 9. $N^+$ type emitter layer 11 is formed to a depth (depth B) shallower than depth A from a surface of p type base layer 9. $P^+$ type contact layer 7 is formed to a position shallower than depth A and deeper than depth B from the surface of p type base layer 9.

A trench 3a extending from the first main surface of semiconductor substrate 3 to a position deeper than depth A has a gate electrode 15 formed therein with a gate insulating film 13 interposed therebetween (MOS gate structure). An interlayer insulating film 17 is formed to cover gate electrode 15. An emitter electrode 19 is formed to cover interlayer insulating film 17. Emitter electrode 19 is in contact with $n^+$ type emitter layer 11 and $p^+$ type contact layer 7.

A $p^+$ type collector layer 23 is formed to a certain depth (depth C) from a second main surface of semiconductor substrate 3. An n type field stop layer 21 is formed from depth C to a position deeper than depth C. A collector electrode 25 is formed in contact with $p^+$ type collector layer 23. An $n^+$ type drift layer 5 (a region of semiconductor substrate 3) is located between n type field stop layer 21 and p type base layer 9. In the semiconductor device including the IGBT, in addition to a cell region where the IGBT is formed, a termination structure (nor shown) for holding the breakdown voltage is formed in an outer peripheral portion.

As will be described later, semiconductor device 1 including IGBT 2a described above has a profile of carrier concentration in n type field stop layer 21 and a manufacturing method that are different from a profile of carrier concentration in an n type field stop layer and a manufacturing method of a semiconductor device including a conventional IGBT.

In a conventional method of forming an n type field stop layer using hydrogen-related donors by proton radiation, it is necessary to leave radiation-induced defects generated by the proton radiation without completely recovering them by an annealing process after the proton radiation. Therefore, the conventional method causes the radiation-induced defects to remain in the n type field stop layer.

For example, examination by a photoluminescence method of an n type field stop layer formed by proton radiation revealed that radiation-induced defects between interstitial silicon pairs remain in the n type field stop layer. It was also found that a longer annealing time or a higher annealing temperature, which were considered in order to recover the radiation-induced defects, led to recovery of the radiation-induced defects, but resulted in a lowered activation ratio of donors.

Accordingly, when forming an n type field stop layer using only proton radiation, it is inevitable that a large amount of radiation-induced defects will remain, resulting in a large amount of leakage current in an IGBT. In addition, when forming an n type field stop layer using only proton radiation, the activation ratio of donors is low. Accordingly, the formation of an n type field stop layer involves an increased radiation dose of protons and an increased process cost.

To solve such problems, the semiconductor device described above is characterized by the use of a wet process in combination with radiation of charged particles (protons or helium ions) in a back surface step, in order to reduce the radiation-induced defects remaining in n type field stop layer 3.

Thus, an example of a method of manufacturing the semiconductor device above is described next. Radiation of protons as the charged particles is described here. In the following, steps of manufacturing portions that function as an IGBT such as a MOS gate structure can be implemented using a known manufacturing method, and are thus described simply.

Figure 2:
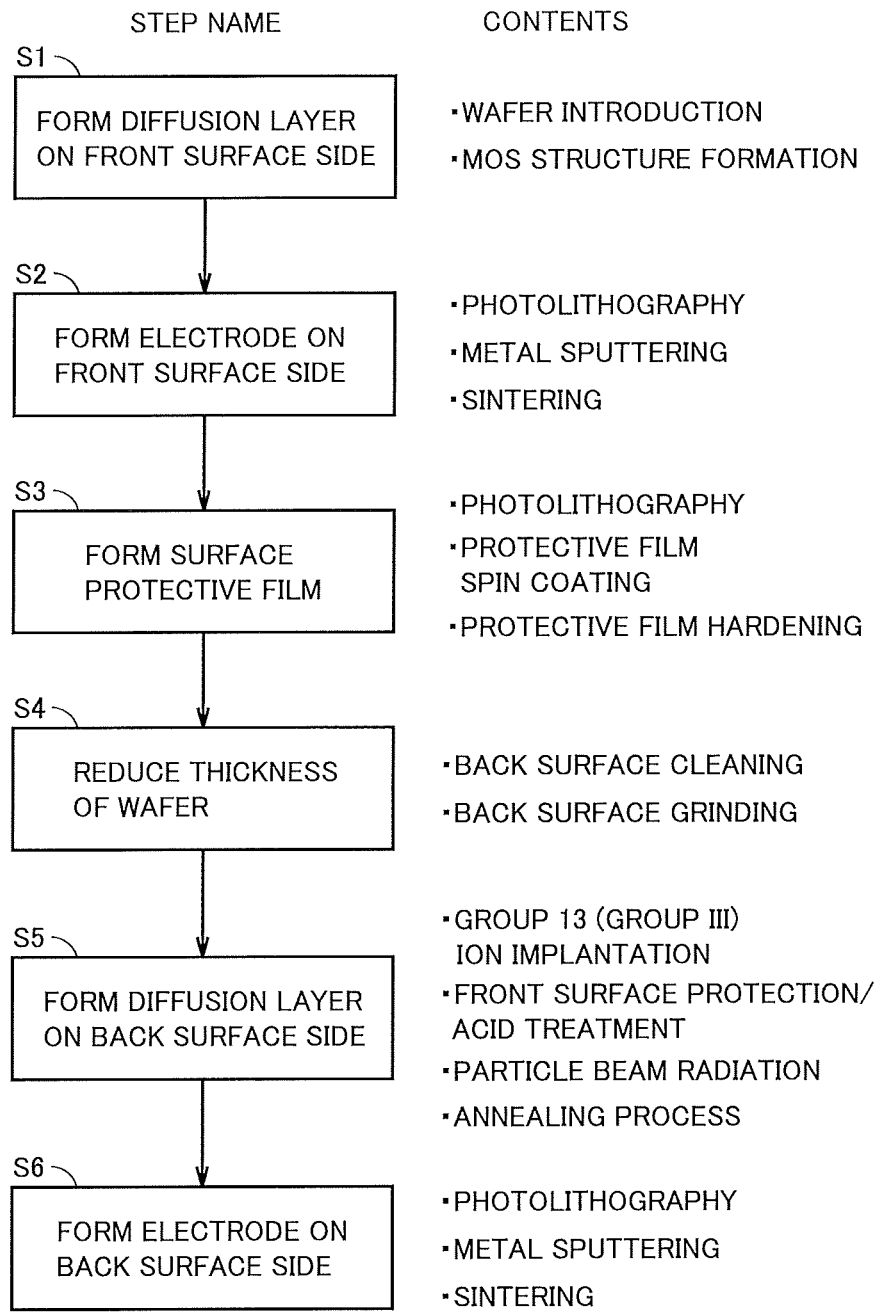
FIG. 2 is a flowchart showing steps of manufacturing the semiconductor device in the first embodiment.

First, a flowchart of the method of manufacturing the semiconductor device is described based on FIG. 2. First, in step S1, various diffusion layers are formed on a front surface side (first main surface side) of the semiconductor substrate. After the semiconductor substrate is introduced, a trench MOS gate structure and the like including $p^+$ type contact layer 7, p type base layer 9, $n^+$ type emitter layer 11, gate insulating film 13 and gate electrode 15 is formed on the first main surface side of semiconductor substrate 3 by a photolithography step, an ion implantation step, an annealing step and the like (see FIG. 1).

Next, in step S2, an electrode is formed on the front surface side of the semiconductor substrate. A metal film is formed to cover $p^+$ type contact layer 7, $n^+$ type emitter layer 11 and the like by a vacuum sputtering method, for example. The metal film is patterned by a photolithography step and an etching step, to form emitter electrode 19. Emitter electrode 19 is in ohmic contact with $p^+$ type contact layer 7 and n type emitter layer 11 (see FIG. 1).

Next, in step S3, a surface protective film covering the first main surface of the semiconductor substrate is formed. A silicon nitride film and the like are formed, for example, as the surface protective film. Alternatively, the protective film may be formed by a spin coating method, for example. Further, a protective film in the form of a sheet may be used. Next, in step S4, the semiconductor substrate is reduced in thickness. The thickness reduction of the semiconductor substrate is performed by grinding a back surface (second main surface) of the semiconductor substrate. The thickness of the semiconductor substrate is determined in relation to the breakdown voltage.

Next, in step S5, a diffusion layer is formed on the back surface side (second main surface side) of the semiconductor substrate. Ions of a Group 13 element are implanted from the back surface of the semiconductor substrate. The "Group 13 element" is represented as a "Group III element" in the short period periodic table. After the protective film is formed on the back surface side (second main surface side) of the semiconductor substrate, a wet process with a chemical solution and proton radiation are performed. An annealing process is subsequently performed to form n type field stop layer 21 and $p^+$ type collector layer 23 (see FIG. 1). This step is a characteristic portion of this invention, and will be described in detail later.

Next, in step S6, an electrode is formed on the back surface side of the semiconductor substrate. A metal film is formed to cover $p^+$ type collector layer 23 by a vacuum sputtering method and the like, to form collector electrode 25. Collector electrode 25 is in ohmic contact with $p^+$ type collector layer 23. The semiconductor device including the IGBT having n type field stop layer 21 is thus completed (see FIG. 1).

In this method, owing to the inclusion of step S5, radiation-induced defects in the n type field stop layer are reduced, and furthermore, the n type field stop layer having a high activation ratio of hydrogen-related donors is formed. Next, the step of forming the diffusion layer on the back surface side of the semiconductor substrate is described in detail.

In a step of forming hydrogen-related donors using proton radiation, balance between the concentration of radiation-induced defects and the concentration of hydrogen atoms that are introduced into a semiconductor substrate affects an activation ratio of the hydrogen-related donors. The "activation" as used here means reaction of the radiation-induced defects and the hydrogen atoms formed in the semiconductor substrate by the proton radiation. Specifically, it is assumed that a negatively charged hydrogen atom bonds with a silicon dangling bond of a radiation-induced defect to form a covalent bond, and one extra electron is released from the dangling bond or the hydrogen atom, to form a donor. The activation ratio means the ratio of the amount of newly generated donors (numerator) to the amount of radiated protons (denominator).

In proton radiation, a distribution of hydrogen atoms is concentrated around an average range of the proton radiation. Thus, there is a shortage of hydrogen atoms in a region closer to the back surface side of the semiconductor substrate than the average range. In other words, only radiation-induced defects are formed in that region. As a result, the activation ratio of hydrogen-related donors is lowered.

A radiation-induced defect whose dangling bond was not terminated by a hydrogen atom has an impurity level in the forbidden band of a semiconductor energy band, causing reduced mobility or increased leakage current in the semiconductor device. The leakage current means a current that flows when a reverse bias is applied to a semiconductor chip (semiconductor device), and the current flows by the generation of electrons and holes from a radiation-induced defect.

Thus, it was found by the inventor's research that a larger amount of hydrogen atoms should be diffused into a semiconductor substrate, in order to reduce the remaining radiation-induced defects whose dangling bonds are not terminated, and to form an n type field stop layer having a high activation ratio. Based on this finding, the inventor found a method of supplying hydrogen atoms into a semiconductor substrate using a wet process, in addition to the proton radiation, in step S5.

Figure 3:
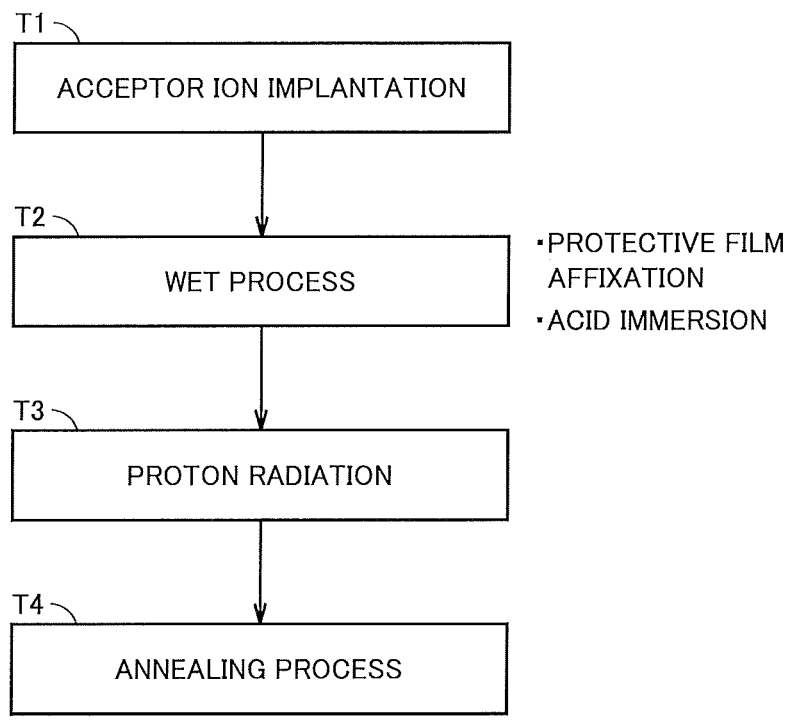
FIG. 3 is a flowchart showing steps of forming a diffusion layer on a back surface side of a semiconductor substrate in the first embodiment.

As shown in FIG. 3, first, in step T1, acceptor ions are implanted from the back surface of the semiconductor substrate. The acceptor ions may be boron ions, for example, but are not limited to the boron ions as long as they are ions of a Group 13 element. Next, local heat treatment that does not affect the front surface side of the semiconductor substrate is performed by laser annealing, to activate the implanted acceptor ions.

Next, in step T2, a wet process of immersing the semiconductor substrate in a chemical solution is performed. In this step T2, a protective film is affixed to the front surface of the semiconductor substrate in order to protect emitter electrode 19 (see FIG. 1) of the IGBT formed on the front surface side of the semiconductor substrate from the chemical solution. As this protective film, a protective film used to protect the front surface of the semiconductor substrate in the step of reducing the thickness of the semiconductor substrate may be used.

Next, with the protective film affixed to the front surface of the semiconductor substrate, a wet process of diffusing hydrogen atoms into the semiconductor substrate from the back surface of the semiconductor substrate is performed. A chemical solution used for this wet process is preferably a chemical solution including an acid such as hydrofluoric acid. This wet process may be performed at room temperature, but is preferably performed while the chemical solution is heated to a temperature of about 50 to 90° C. in order to increase the amount of diffused hydrogen atoms. The acid used may be hydrochloric acid, sulfuric acid or nitric acid, other than the hydrofluoric acid.

This wet process introduces hydrogen atoms into the semiconductor substrate. It is known that a hydrogen atom chemically bonds with a boron atom introduced during proton ion implantation, to form a B—H bond. The B—H bond is assumed to be stable at room temperature. Accordingly, the hydrogen atoms are not vaporized from within the semiconductor substrate when the semiconductor substrate is held at room temperature after the wet process is performed. In this manner, the wet process is performed to accumulate hydrogen atoms in a region of the semiconductor substrate where the acceptor ions have been implanted.

Next, in step T3, proton radiation is provided to the back surface of the semiconductor substrate. Since the proton radiation is provided only this one time in the series of steps of the semiconductor device, an average range of protons is the location of a depth of the n type field stop layer that is spaced furthest away from the back surface of the semiconductor substrate. Thus, the depth of energy of the proton radiation needs to be determined in consideration of the breakdown voltage required of the IGBT. According to calculation with simulation software by the inventor, it was estimated that, when proton incident energy is 1 MeV, for example, the distance from the back surface of the semiconductor substrate to the end (depth) of the n type field stop layer is about 16 µm.

A high radiation dose of protons is desirable because the carrier concentration in the n type field stop layer is thereby increased. However, increase in the radiation dose also involves increase in radiation-induced defects and process cost. A low radiation dose of protons, on the other hand, causes reduction in radiation-induced defects, resulting in inability to set a desired carrier concentration in the n type field stop layer. For this reason, the inventor set the proton radiation dose from $5\times10^{11}/cm^2$ to $1\times10^{15}/cm^2$.

In this manner, the wet process and the proton radiation are performed to form radiation-induced defects and accumulate hydrogen atoms in a region on the back surface side of the semiconductor substrate. Although the proton radiation has been described as being provided after the wet process is performed in the method above, the wet process may be performed after the proton radiation is provided.

Next, in step T4, an annealing process is performed on the semiconductor substrate in order to diffuse the hydrogen atoms accumulated in the semiconductor substrate. The annealing process is performed using a diffusion furnace, for example. The annealing process is performed on the semiconductor substrate for 0.5 hours to 5 hours at a temperature from 300° C. to 500° C. in an inert gas atmosphere. The annealing process is more preferably performed at a temperature from 350° C. to 450° C. in order to efficiently activate the hydrogen-related donors. The inventor confirmed that the hydrogen-related donors cannot be formed efficiently when the temperature is lower than 300° C. or higher than 500° C., and when the time is shorter than 0.5 hours or longer than 5 hours.

As a result of this annealing process, the hydrogen atoms supplied by the proton radiation are diffused toward the back surface of the semiconductor substrate from within the semiconductor substrate, and are also diffused to the side opposite to the back surface of the semiconductor substrate from within the semiconductor substrate. In addition, the hydrogen atoms supplied by the wet process are diffused into the semiconductor substrate from the back surface of the semiconductor substrate.

As described above, in a region (region R) from the back surface of the semiconductor substrate to the location of the average range of protons, radiation-induced defects are formed by the proton radiation. During the annealing process, of the hydrogen atoms supplied by the proton radiation and diffused, hydrogen atoms diffused toward the back surface of the semiconductor substrate from the location of the average range, and hydrogen atoms supplied by the wet process and diffused into the semiconductor substrate from the back surface of the semiconductor substrate are captured by the radiation-induced defects formed in region R.

Because of the capturing of the hydrogen atoms by the radiation-induced defects, silicon dangling bonds of the radiation-induced defects are terminated. As a result, some of the radiation-induced defects are converted into hydrogen-related donors, and radiation-induced defects that caused reduction in mobility are rendered electrically inert. The radiation-induced defects can thus be reduced. In addition, since the proton radiation is provided one time, the manufacturing cost can also be reduced as compared to an example where the proton radiation is provided multiple times.

Figure 4:
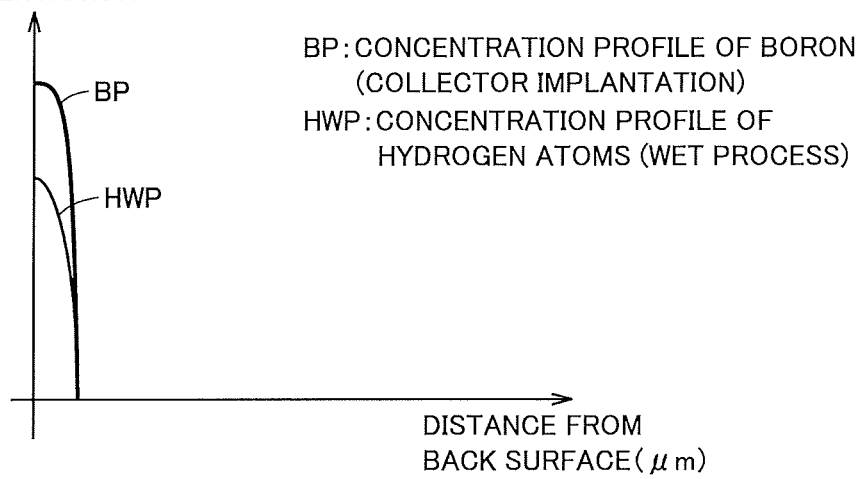
FIG. 4 shows a distribution of boron and a distribution of hydrogen atoms in the semiconductor substrate after acceptor ion implantation and a wet process are performed in the first embodiment.

Next, a supplementary explanation of step S5 described above is given with reference to concentration profiles. First, FIG. 4 shows distributions of the concentration of impurity (boron) and the concentration of hydrogen atoms in the depth direction from the back surface of the semiconductor substrate, after the acceptor ions are implanted and the wet process is performed. As shown in FIG. 4, it can be seen that the boron (acceptor ions) is distributed over a relatively shallow region of up to about 1 µm from the back surface of the semiconductor substrate (see BP, HWP). Boron captures a hydrogen atom to form a B—H bond. Accordingly, the hydrogen atoms have a distribution in the depth direction analogous to the distribution of boron in the depth direction.

Figure 5:
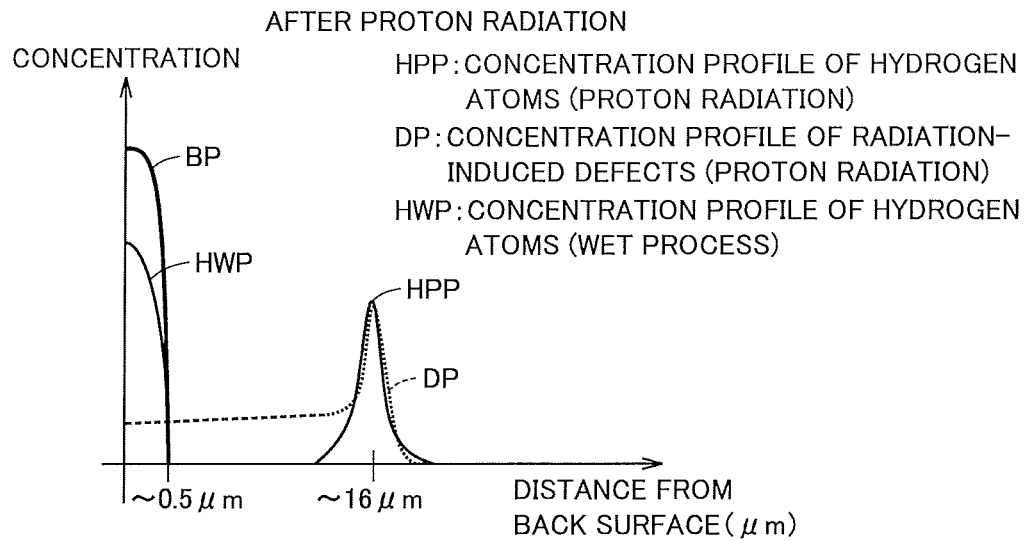
FIG. 5 is a diagram including a distribution of hydrogen atoms and a distribution of radiation-induced defects in the semiconductor substrate after proton radiation is provided in the first embodiment.

Next, FIG. 5 shows distributions of the concentration of impurity (boron) and the concentration of hydrogen atoms in the depth direction from the back surface of the semiconductor substrate, after the proton radiation. The proton radiation leads to accumulation of hydrogen atoms and formation of radiation-induced defects in the semiconductor substrate. The accumulated hydrogen atoms do not refer to the existence of a minute amount of hydrogen such as mixed in a semiconductor manufacturing process, but refers to hydrogen at a concentration within the range from $1\times10^{16}$ to $1\times10^{21}$ atoms/cm$^3$, which is the same level as the implanted acceptor ions. As shown in FIG. 5, the distribution of hydrogen atoms is concentrated at the location of an average range of about 16 μm from the back surface of the semiconductor substrate (see HPP). The radiation-induced defects are distributed such that they are concentrated around the location of the average range, and decrease toward the back surface of the semiconductor substrate from around the location of the average range (see DP).

Figure 6:
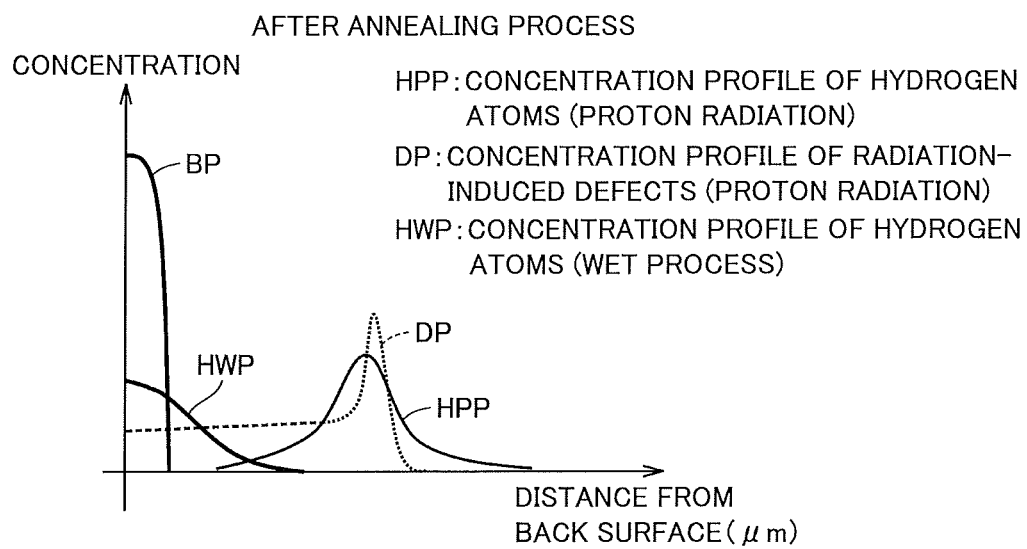
FIG. 6 is a diagram including a distribution of hydrogen atoms introduced by the proton radiation and a distribution of hydrogen atoms introduced by the wet process in the semiconductor substrate after an annealing process is performed in the first embodiment.

Next, FIG. 6 shows distributions of the concentration of hydrogen atoms by the proton radiation and the concentration of hydrogen atoms by the wet process in the depth direction from the back surface of the semiconductor substrate, after the annealing process. As shown in FIG. 6, it can be seen that the distributions of the concentration of hydrogen atoms by the proton radiation and the concentration of hydrogen atoms by the wet process spread in the depth direction of the semiconductor substrate.

As a result of the annealing process, around the location of the average range from the back surface of the semiconductor substrate, the radiation-induced defects and the hydrogen atoms react with each other to generate hydrogen-related donors. In addition, the hydrogen atoms introduced by the wet process and diffused into the semiconductor substrate from the back surface of the semiconductor substrate, and some of the radiation-induced defects formed between the back surface of the semiconductor substrate and around the location of the average range react with each other to generate hydrogen-related donors, and furthermore, radiation-induced defects that caused reduction in mobility are rendered electrically inert. The radiation-induced defects are thus reduced.

In the method of manufacturing the semiconductor device described above, a large amount of hydrogen atoms is supplied from the back surface of the semiconductor substrate by the wet process, as compared to the methods proposed in PTL 1 and PTL 2. As a result, after the annealing process, a desired amount of hydrogen-related donors can be generated by the reaction of the hydrogen atoms and the radiation-induced defects, and the radiation-induced defects can be effectively terminated, to suppress the reduction in mobility and the leakage current in the semiconductor device.

Figure 7:
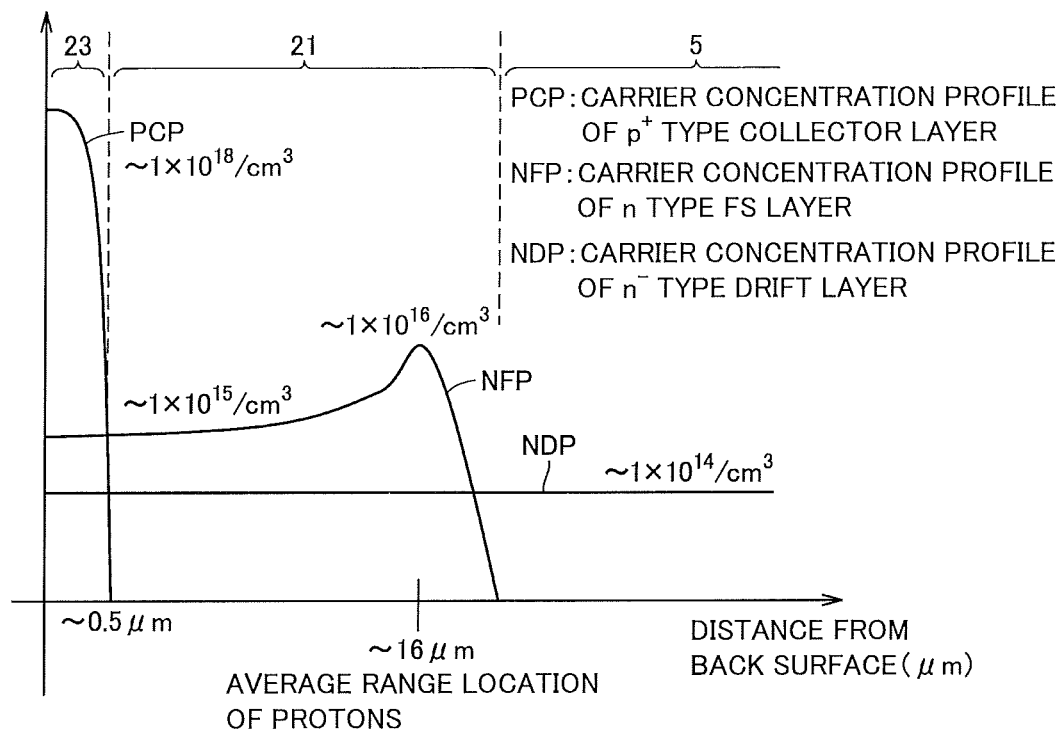
FIG. 7 is a diagram including design distributions of carrier concentration in a field stop layer in the first embodiment.
Figure 8:
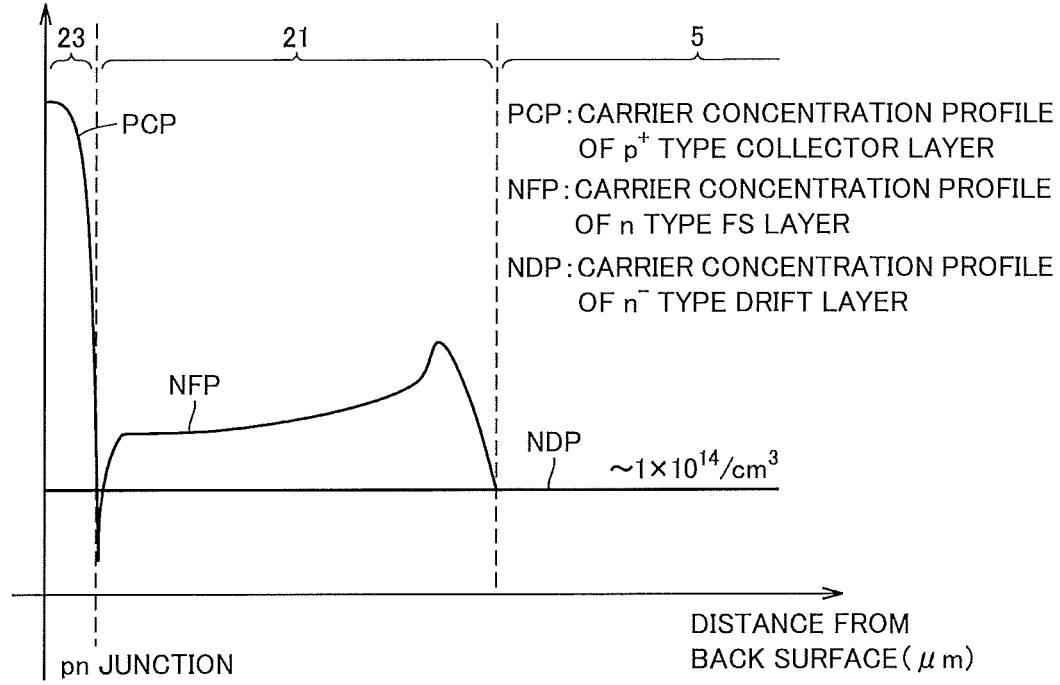
FIG. 8 is a diagram including distributions of carrier concentration in the field stop layer in a completed semiconductor device in the first embodiment.

Next, each carrier concentration in the semiconductor device manufactured by the manufacturing method above is described. FIG. 7 shows a design profile of carrier concentration in each region of the semiconductor device, and FIG. 8 shows a profile of carrier concentration in each region of a semiconductor device actually manufactured. The profile of carrier concentration can be acquired by a common SR (Spreading Resistance Profiling) method.

As shown in FIGS. 7 and 8, the carrier concentration in n type field stop layer 21 has a peak at the location of an average range of protons. The carrier concentration in n type field stop layer 21 decreases continuously and gradually toward the back surface of the semiconductor substrate from the location of the average range. In n type field stop layer 21, the hydrogen atoms terminate the silicon dangling bonds of radiation-induced defects, thus eliminating radiation-induced defects that cause reduction in carrier mobility.

Second Embodiment

Another example of the method of manufacturing the semiconductor device according to the first embodiment is described in a second embodiment. A manufacturing method using helium ions as charged particles is described here.

Figure 9:
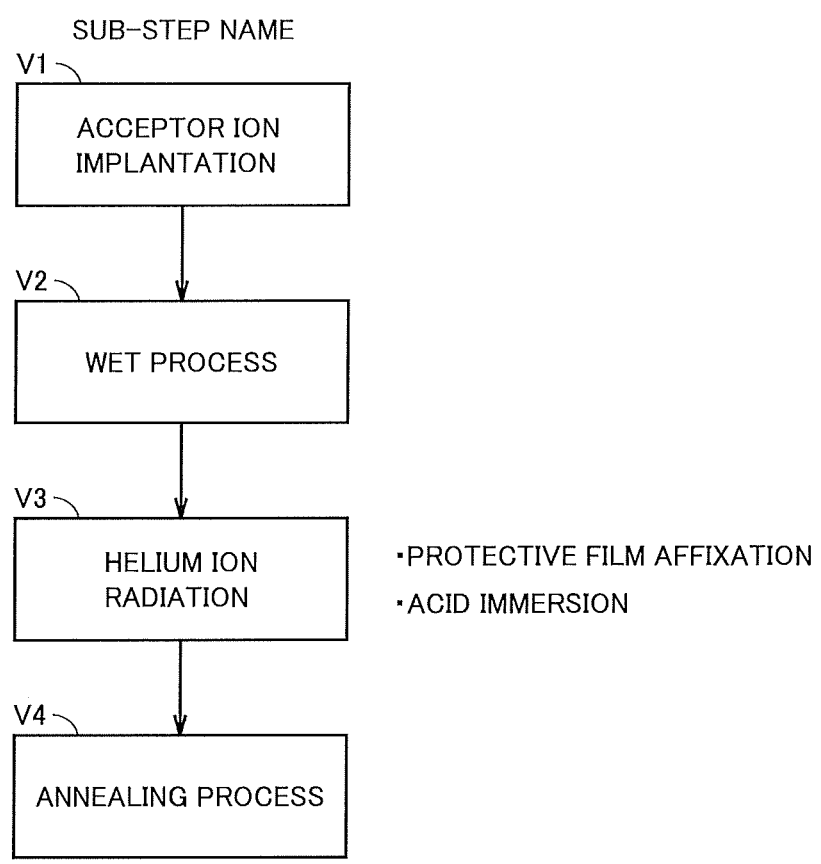
FIG. 9 is a flowchart showing steps of forming a diffusion layer on a back surface side of a semiconductor substrate in a semiconductor device according to a second embodiment.

FIG. 9 shows a flowchart of steps of forming a diffusion layer on the back surface side of the semiconductor substrate. As shown in FIG. 9, acceptor ions are implanted in step V1. A wet process is performed in step V2. Helium ion radiation is provided in step V3. An annealing process is performed in step V4. Except for step V3 of the series of steps V1 to V4, step V1 is substantially the same as step T1, step V2 is substantially the same as step T2, and step V4 is substantially the same as step T4. Therefore, step V3 is described here, and a description of step V1, step V2 and step V4 will not be repeated except when necessary.

In step V3, helium ion radiation is provided to the back surface of the semiconductor substrate. The depth of energy of the helium ions needs to be determined in consideration of the breakdown voltage required of the IGBT. According to calculation with simulation software by the inventor, it was estimated that, in the case of He4 which is assumed to be high in abundance among isotopes, as an example of the helium ions, when He4 incident energy is 3.75 MeV, the distance from the back surface of the semiconductor substrate to the end (depth) of the n type field stop layer is about 16 μm.

In the case of helium ions, too, a high radiation dose of helium ions is desirable because the carrier concentration in the n type field stop layer is thereby increased. However, increase in the radiation dose also involves increase in radiation-induced defects and process cost. A low radiation dose of helium ions, on the other hand, causes reduction in radiation-induced defects, resulting in inability to set a desired carrier concentration in the n type field stop layer. For this reason, the inventor set the helium ion radiation dose from $5\times10^{10}/cm^2$ to $1\times10^{14}/cm^2$. The reason that the helium ion radiation dose was set to be lower than the proton radiation dose is because more defects are formed by helium ions than by protons.

In this manner, the wet process and the helium ion radiation are performed to form radiation-induced defects and accumulate hydrogen atoms in a region on the back surface side of the semiconductor substrate. Although the helium ion radiation has been described as being provided after the wet process is performed in the method above, the wet process may be performed after the helium ion radiation is provided.

Next, in step V4, an annealing process is performed on the semiconductor substrate in order to diffuse the hydrogen atoms accumulated in the semiconductor substrate. The annealing process is performed using a diffusion furnace, for example. The annealing process is performed on the semiconductor substrate for 0.5 hours to 5 hours at a temperature from 300° C. to 500° C. in an inert gas atmosphere. The annealing process is more preferably performed at a temperature from 350° C. to 450° C. in order to efficiently activate the hydrogen-related donors.

As a result of this annealing process, the hydrogen atoms supplied by the wet process are diffused into the semiconductor substrate from the back surface of the semiconductor substrate. Unlike the proton radiation, hydrogen does not enter the substrate during the helium ion radiation.

As described above, in the region (region R) from the back surface of the semiconductor substrate to the location of the average range of helium ions, radiation-induced defects are formed by the helium ion radiation. During the annealing process, hydrogen atoms supplied by the wet process and diffused into the semiconductor substrate from the back surface of the semiconductor substrate are captured by the radiation-induced defects formed in region R. In the helium ion radiation, there are no hydrogen atoms that are diffused toward the back surface of the semiconductor substrate from the location of the average range of helium ions.

Because of the capturing of the hydrogen atoms by the radiation-induced defects, silicon dangling bonds of the radiation-induced defects are terminated. As a result, some of the radiation-induced defects are converted into hydrogen-related donors, and radiation-induced defects that caused reduction in mobility are rendered electrically inert. The radiation-induced defects can thus be reduced. In addition, since the helium ion radiation is provided one time, the manufacturing cost can also be reduced as compared to an example where the proton radiation is provided multiple times.

Steps V1 to V4 described above correspond to step S5 shown in FIG. 2. Next, a supplementary explanation of step S5 is given with reference to concentration profiles. As described above, first, FIG. 4 shows distributions of the concentration of impurity (boron) and the concentration of hydrogen atoms in the depth direction from the back surface of the semiconductor substrate, after the acceptor ions are implanted and the wet process is performed. As shown in FIG. 4, it can be seen that the boron (acceptor ions) is distributed over a relatively shallow region of up to about 1 μm from the back surface of the semiconductor substrate (see BP, HWP). Boron captures a hydrogen atom to form a B—H bond. Accordingly, the hydrogen atoms have a distribution in the depth direction analogous to the distribution of boron in the depth direction.

Figure 10:
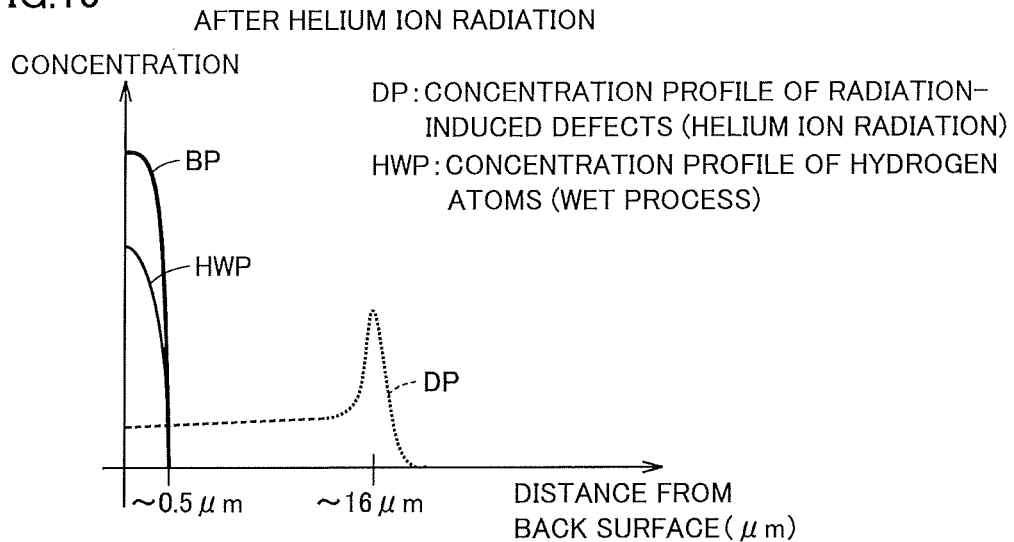
FIG. 10 is a diagram showing a distribution of hydrogen atoms and a distribution of radiation-induced defects in the semiconductor substrate after helium ion radiation is provided in the second embodiment.

Next, FIG. 10 shows distributions of the concentration of impurity (boron) and the concentration of hydrogen atoms in the depth direction from the back surface of the semiconductor substrate, after the helium ion radiation. The helium ion radiation leads to formation of radiation-induced defects in the semiconductor substrate. The radiation-induced defects are distributed such that they are concentrated around the location of the average range, and decrease toward the back surface of the semiconductor substrate from around the location of the average range (see DP).

Figure 11:
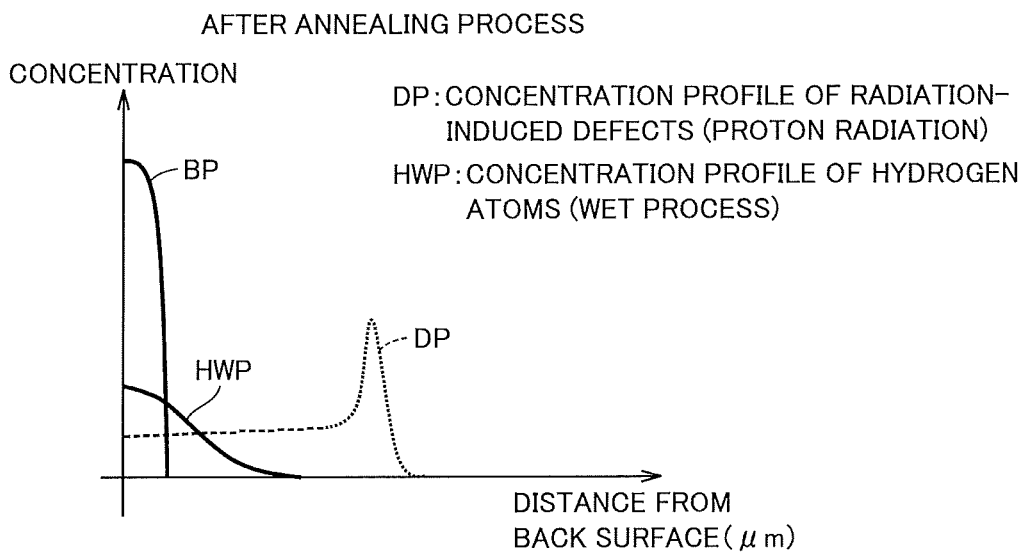
FIG. 11 is a diagram including a distribution of hydrogen atoms introduced by a wet process after an annealing process is performed in the second embodiment.

Next, FIG. 11 shows a distribution of the concentration of hydrogen atoms by the wet process after the annealing process, in the depth direction from the back surface of the semiconductor substrate. As shown in FIG. 11, it can be seen that the distribution of the concentration of hydrogen atoms by the wet process spreads in the depth direction of the semiconductor substrate after the annealing process.

As a result of the annealing process, around the location of the average range from the back surface of the semiconductor substrate, the hydrogen atoms introduced by the wet process and diffused into the semiconductor substrate from the back surface of the semiconductor substrate, and some of the radiation-induced defects formed between the back surface of the semiconductor substrate and around the location of the average range react with each other to generate hydrogen-related donors, and furthermore, radiation-induced defects that caused reduction in mobility are rendered electrically inert. The radiation-induced defects are thus reduced.

In the method of manufacturing the semiconductor device described above, a large amount of hydrogen atoms is supplied from the back surface of the semiconductor substrate by the wet process, as compared to the methods proposed in PTL 1 and PTL 2. As a result, after the annealing process, a desired amount of hydrogen-related donors can be generated by the reaction of the hydrogen atoms and the radiation-induced defects, and the radiation-induced defects can be effectively terminated, to suppress the reduction in mobility and the leakage current in the semiconductor device.

Figure 12:
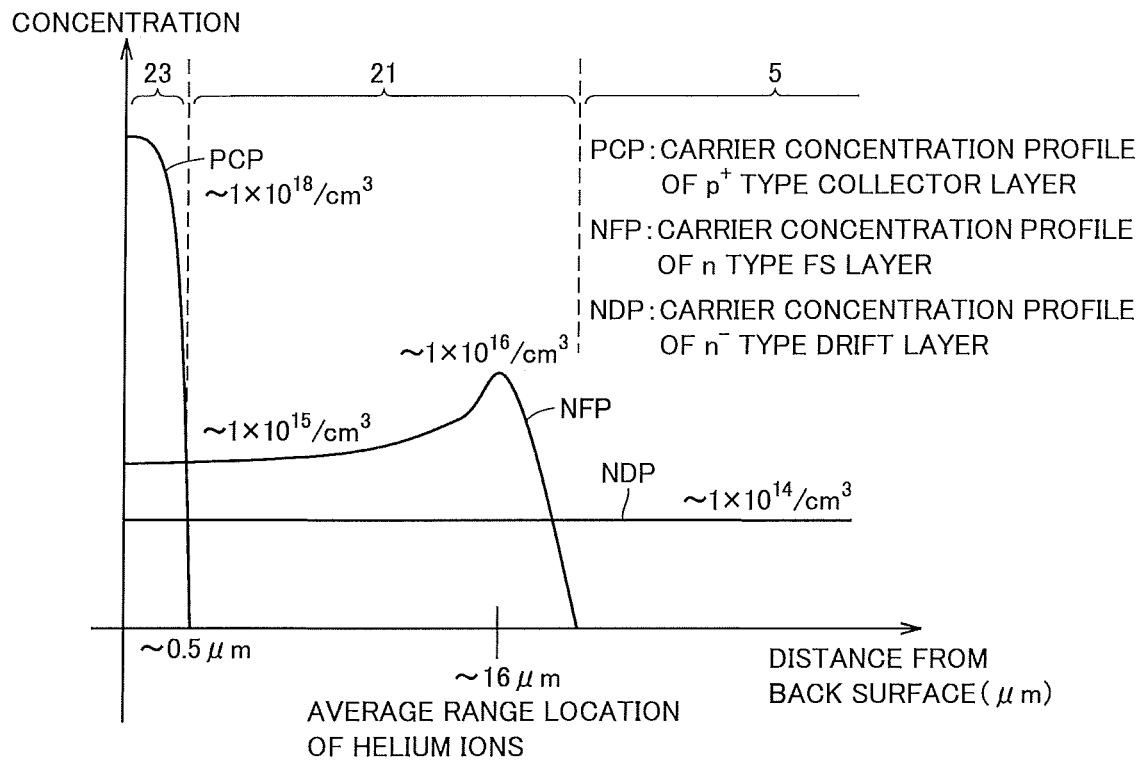
FIG. 12 is a diagram including design distributions of carrier concentration in a field stop layer in the second embodiment.

Next, each carrier concentration in the semiconductor device manufactured by the manufacturing method above is described. FIG. 12 shows a design profile of carrier concentration in each region of the semiconductor device, and FIG. 13 shows a profile of carrier concentration in each region of a semiconductor device actually manufactured.

Figure 13:
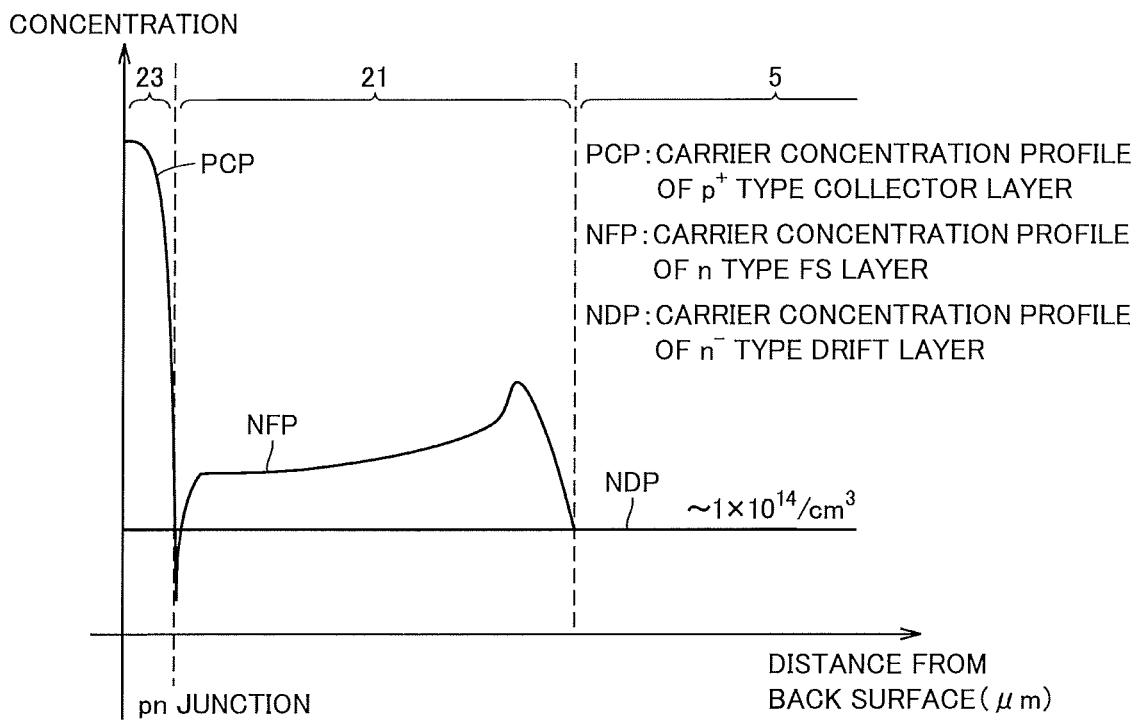
FIG. 13 is a diagram including distributions of carrier concentration in the field stop layer in a completed semiconductor device in the second embodiment.

As shown in FIGS. 12 and 13, the carrier concentration in n type field stop layer 21 has a peak at the location of an average range of protons. The carrier concentration in n type field stop layer 21 decreases continuously and gradually toward the back surface of the semiconductor substrate from the location of the average range. In n type field stop layer 21, the hydrogen atoms terminate the silicon dangling bonds of radiation-induced defects, thus eliminating radiation-induced defects that cause reduction in carrier mobility.

Third Embodiment

Figure 14:
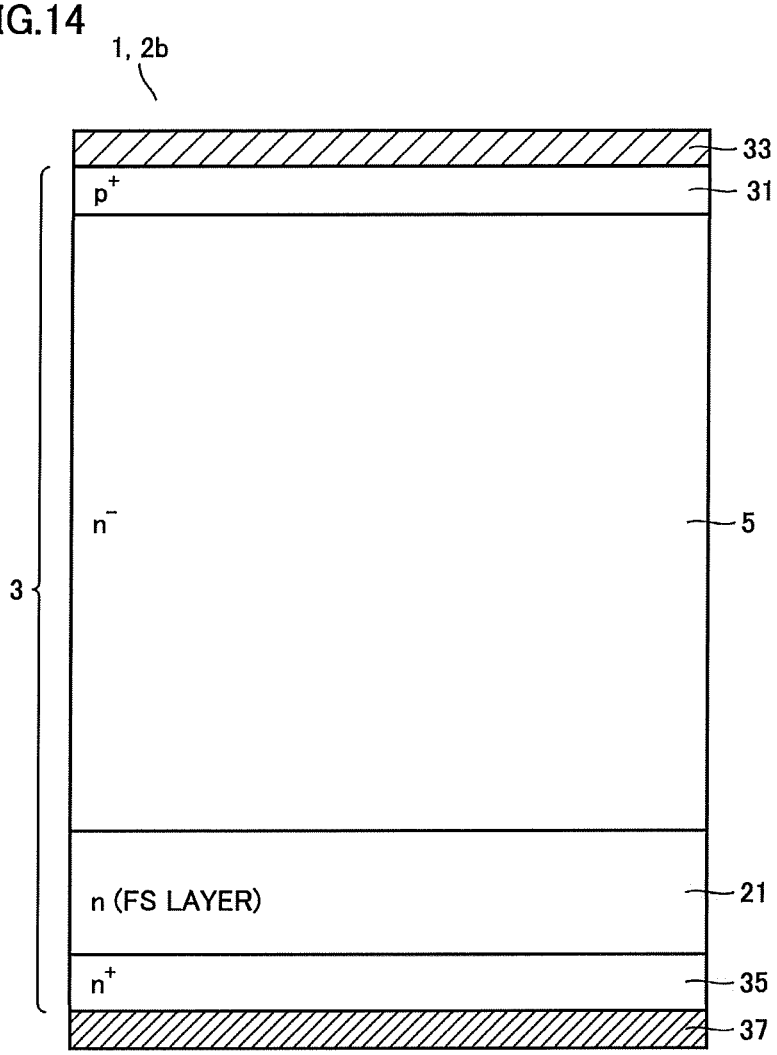
FIG. 14 is a cross-sectional view of a semiconductor device including a diode according to a third embodiment.

A semiconductor device including a diode is described here as an example of a semiconductor device. Radiation of protons as charged particles is described as its manufacturing method. As shown in FIG. 14, in semiconductor device 1 including a diode 2b, a $p^+$ type anode layer 31 is formed to a certain depth from the first main surface of semiconductor substrate 3. An anode electrode 33 is formed in contact with $p^+$ type anode layer 31.

An $n^+$ type cathode layer 35 is formed to a certain depth (depth D) from the second main surface of semiconductor substrate 3. N type field stop layer 21 is formed from depth D to a position deeper than depth D. A cathode electrode 37 is formed in contact with $n^+$ type cathode layer 35. $N^-$ type drift layer 5 is located between n type field stop layer 21 and $p^+$ type anode layer 31. In the semiconductor device including the diode, in addition to a cell region where the diode is formed, a termination structure (nor shown) for holding the breakdown voltage is formed in an outer peripheral portion.

Next, a method of manufacturing the semiconductor device above is described. The semiconductor device including the diode is manufactured by substantially the same manufacturing method as the method of manufacturing the semiconductor device including the IGBT described above (see FIG. 2), except for the back surface diffusion step. The difference in the back surface diffusion step is described later.

First, a diffusion layers is formed on the front surface side (first main surface side) of semiconductor substrate 3. After semiconductor substrate 3 is introduced, $p^+$ type anode layer 31 is formed on the first main surface side of semiconductor substrate 3 by a photolithography step, an ion implantation step, a reactive ion etching step and the like (see step S1 in FIG. 2, FIG. 14).

Next, an electrode is formed on the front surface side of semiconductor substrate 3. A metal film is formed to cover $p^+$ type anode layer 31 and the like by a vacuum sputtering method, for example. The metal film is patterned by a photolithography step and an etching step, to form anode electrode 33. Anode electrode 33 is in ohmic contact with $p^+$ type anode layer 31 (see step S2 in FIG. 2, FIG. 14).

Next, a surface protective film covering the first main surface of semiconductor substrate 3 is formed. A polyimide film is formed, for example, as the surface protective film (see step S3 in FIG. 2, FIG. 14). Next, semiconductor substrate 3 is reduced in thickness. The thickness reduction of semiconductor substrate 3 is performed by grinding the back surface (second main surface) of semiconductor substrate 3. The thickness of semiconductor substrate 3 is determined in relation to the breakdown voltage (see step S4 in FIG. 2).

Next, n type field stop layer 21 and n⁺ type cathode layer 35 are formed as a diffusion layer on the back surface side (second main surface side) of semiconductor substrate 3 (see step S5 in FIG. 2). The step of forming n type field stop layer 21 is described later.

Next, an electrode is formed on the back surface side of semiconductor substrate 3. A metal film is formed to cover n⁺ type cathode layer 35 by a vacuum sputtering method and the like, to form cathode electrode 37. Cathode electrode 37 is in ohmic contact with n⁺ type cathode layer 35. The semiconductor device including the diode having n type field stop layer 21 shown in FIG. 14 is thus completed (see step S6 in FIG. 2, FIG. 14).

Next, the step of forming the diffusion layer on the back surface side of the semiconductor substrate is described in detail. Generally, a step of implanting acceptor ions into a back surface side of a semiconductor substrate is not provided for a semiconductor device including a diode, unlike a semiconductor device including an IGBT. Thus, a step of implanting acceptor ions into a back surface of a semiconductor substrate is added for a semiconductor device including a diode.

Figure 15:
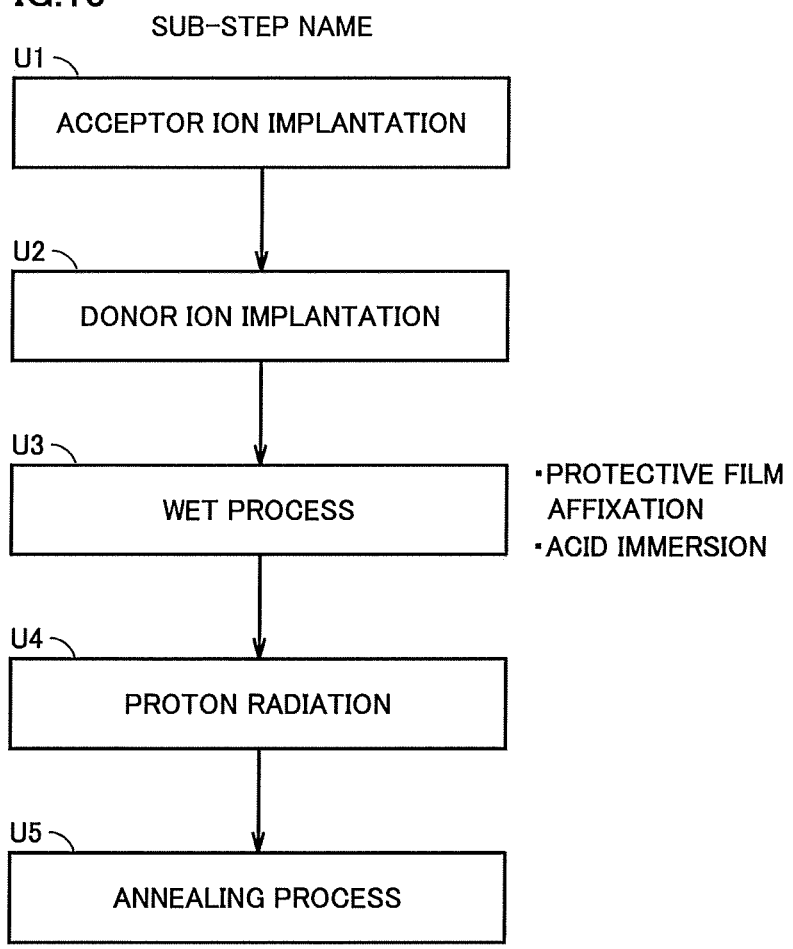
FIG. 15 is a flowchart showing steps of forming a diffusion layer on a back surface side of a semiconductor substrate in the third embodiment.

Therefore, as shown in FIG. 15, first, in step U1, boron ions are implanted, for example, as acceptor ions from the back surface of the semiconductor substrate.

Next, in step U2, donor ions which will be an n⁺ type cathode layer are implanted. The donor ions may be phosphorus ions, for example. Next, local heat treatment that does not affect the front surface side of the semiconductor substrate is performed by laser annealing, to activate the implanted donor ions. At this time, implantation conditions (implantation energy, dose amount) are set in advance such that, when a distribution of the acceptor ions and a distribution of the donor ions are overlaid on each other, the concentration of the donor ions located in a region where the n⁺ type cathode layer is formed is 100 times or more higher than the concentration of the acceptor ions located in that region.

By establishing such concentration relationship, the n⁺ type cathode layer capable of accumulating hydrogen atoms therein can be formed by the subsequently performed wet process, while the conductivity type of the n⁺ type cathode layer is maintained as n type. In other words, the n⁺ type cathode layer in which B—H bonds can be provided can be formed.

Although the implantation conditions are set here such that the acceptor ions remain in the region where the n⁺ type cathode layer is formed, the acceptor ions may be distributed to a region spaced further away from the back surface of the semiconductor substrate than the region where the n⁺ type cathode layer is formed. In this case, the concentration of acceptor ions in the region spaced further away than the region where the n⁺ type cathode layer is formed is desirably set to one-hundredth or less of the carrier concentration in the n⁻ type drift layer. Accordingly, carrier compensation or defects in the n⁻ type drift layer that are generated by the introduction of acceptor ions can be prevented from yielding a significant effect on the characteristics of the semiconductor device.

Next, in step U3, a wet process of immersing the semiconductor substrate in a chemical solution is performed. At this time, a protective film is affixed to the front surface of the semiconductor substrate in order to protect anode electrode 33 (see FIG. 14) of the diode formed on the front surface side of the semiconductor substrate from the chemical solution.

Next, in step U4, proton radiation is provided to the back surface of the semiconductor substrate. At this time, as was described with regard to step T3 (see FIG. 3), the proton radiation dose is desirably set from $5 \times 10^{11}/cm^2$ to $1 \times 10^{15}/cm^2$.

Next, in step U5, an annealing process is performed on the semiconductor substrate in order to diffuse the hydrogen atoms accumulated in the semiconductor substrate. At this time, as was described with regard to step T4 (see FIG. 3), the annealing process is performed on the semiconductor substrate for 0.5 hours to 5 hours at a temperature from 300° C. to 500° C. in an inert gas atmosphere.

In the semiconductor device including the diode manufactured by the steps described above, the distribution of carrier concentration in n type field stop layer 21 is the same as the distribution of carrier concentration in the n type field stop layer in the semiconductor device including the IGBT described above. In the n type field stop layer, therefore, the hydrogen atoms terminate the dangling bonds of radiation-induced defects, thus eliminating radiation-induced defects that cause reduction in carrier mobility.

Fourth Embodiment

Another example of the method of manufacturing the semiconductor device according to the third embodiment is described in a fourth embodiment. A manufacturing method using helium ions as charged particles is described here.

Figure 16:
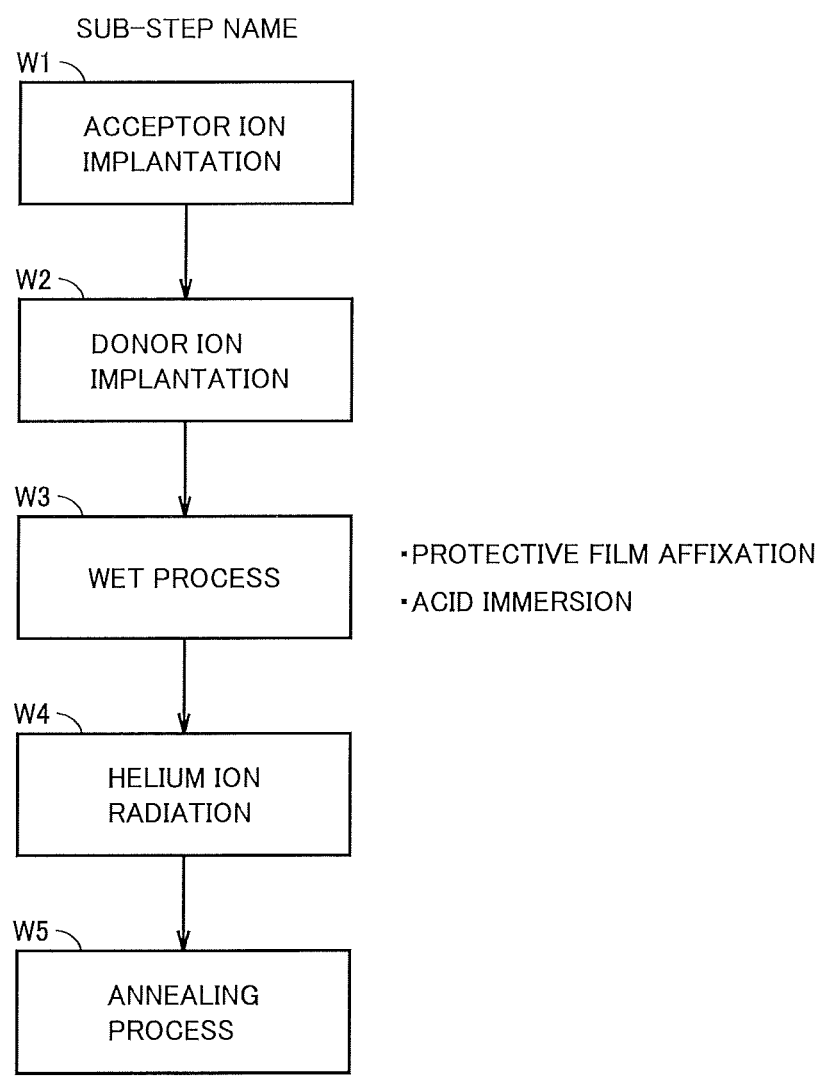
FIG. 16 is a flowchart showing steps of forming a diffusion layer on a back surface side of a semiconductor substrate in a semiconductor device according to a fourth embodiment.

FIG. 16 shows a flowchart of steps of forming a diffusion layer on the back surface side of the semiconductor substrate. As shown in FIG. 16, acceptor ions are implanted in step W1. Donor ions are implanted in step W2. A wet process is performed in step W3. Helium ion radiation is provided in step W4. An annealing process is performed in step W5. Except for step W4 of the series of steps W1 to W5, step W1 is substantially the same as step U1, step W2 is substantially the same as step U2, step W3 is substantially the same as step U3, and step W5 is substantially the same as step U5. Therefore, step W4 is described here, and a description of step W1 to step W3 and step W5 will not be repeated except when necessary.

In step W4, helium ion radiation is provided to the back surface of the semiconductor substrate. At this time, as was described with regard to step V3 (see FIG. 9), the helium ion radiation dose is desirably set from $5 \times 10^{10}/cm^2$ to $1 \times 10^{14}/cm^2$.

Next, in step W5, an annealing process is performed on the semiconductor substrate in order to diffuse the hydrogen atoms accumulated in the semiconductor substrate. At this time, as was described with regard to step V4 (see FIG. 9), the annealing process is performed on the semiconductor substrate for 0.5 hours to 5 hours at a temperature from 300° C. to 500° C. in an inert gas atmosphere.

In the semiconductor device including the diode manufactured by the steps described above, the distribution of carrier concentration in n type field stop layer 21 is the same as the distribution of carrier concentration in n type field stop layer 21 in the semiconductor device including the IGBT described above. In n type field stop layer 21, therefore, the hydrogen atoms terminate the dangling bonds of radiation-induced defects, thus eliminating radiation-induced defects that cause reduction in carrier mobility.

The semiconductor devices described in the respective embodiments can be combined in various manners as needed.

The embodiments disclosed herein are illustrative and non-restrictive. The scope of the present invention is defined by the terms of the claims, rather than the description above, and is intended to include any modifications within the meaning and scope equivalent to the terms of the claims.

INDUSTRIAL APPLICABILITY

The present invention is effectively utilized for a semiconductor device including a field stop layer.

REFERENCE SIGNS LIST 1 semiconductor device; 2a IGBT; 2b diode; 3 semiconductor substrate; 3a trench; 5 n⁻ type drift layer; 7 p⁺ type contact layer; 9 p type base layer; 11 n⁺ type emitter layer; 13 gate insulating film; 15 gate electrode; 17 interlayer insulating film; 19 emitter electrode; 21 n type field stop layer; 23 p⁺ type collector layer; 25 collector electrode; 31 p⁺ type anode layer; 33 anode electrode; 35 n⁺ type cathode layer; 37 cathode electrode.

The invention claimed is:

1. A semiconductor device comprising a semiconductor element that conducts a current between a first main surface and a second main surface of a semiconductor substrate of a first conductivity type, the semiconductor device comprising:
   an impurity region formed to a first depth from the second main surface of the semiconductor substrate, the semiconductor substrate having a first carrier concentration; and
   a field stop layer of the first conductivity type, formed from a position of the first depth to a second depth deeper than the first depth in the semiconductor substrate, and having a second carrier concentration higher than the first carrier concentration in the semiconductor substrate,
   a drift layer of the first conductivity type having the first carrier concentration evenly distributed from the second depth toward the first main surface, and the field stop layer is in direct contact with both the drift layer and the impurity region,
   in the field stop layer,
      a maximum value of the second carrier concentration being located between the first depth and the second depth, the maximum value of the second carrier concentration being located closer to the second depth than to the first depth,
      the second carrier concentration exhibiting a distribution in which the second carrier concentration decreases continuously toward the second main surface from a portion where the maximum value of the second carrier concentration is located,
      concentration of radiation-induced defects remaining in the field stop layer being lower than the first carrier concentration in the semiconductor substrate, and hydrogen atoms being accumulated in the impurity region.

2. The semiconductor device according to claim 1, wherein
   the concentration of radiation-induced defects remaining in the field stop layer is one-hundredth or less of the first carrier concentration in the semiconductor substrate.

3. The semiconductor device according to claim 1, wherein
   the hydrogen atoms have a distribution in which concentration of the hydrogen atoms decreases continuously from a surface of the impurity region toward a boundary between the impurity region and the field stop layer.

4. The semiconductor device according to claim 1, wherein
   the semiconductor element includes an IGBT, and
   the impurity region is a collector layer of a second conductivity type.

5. The semiconductor device according to claim 1, wherein
   the semiconductor element includes a diode, and
   the impurity region is a cathode layer of the first conductivity type.

6. The semiconductor device according to claim 1, wherein the maximum value of the second carrier concentration is located at an average range of protons from the second main surface of the semiconductor substrate between the first depth and the second depth.

* * * * *